United States Patent
Kleinen et al.

(10) Patent No.: US 7,315,165 B2
(45) Date of Patent: Jan. 1, 2008

(54) SENSOR ELEMENT

(75) Inventors: Alfred Kleinen, Wassenberg (DE);
Peter Schreuder, Kevelaer (DE);
Matthias Henschel, Rheinmuenster
(DE); Bernd Juergen Lahn, Wegberg
(DE)

(73) Assignee: TI Automotive (Neuss) GmbH, Neuss
(DE)

( * ) Notice: Subject to any disclaimer, the term of this
patent is extended or adjusted under 35
U.S.C. 154(b) by 102 days.

(21) Appl. No.: 10/992,637

(22) Filed: Nov. 18, 2004

(65) Prior Publication Data

US 2005/0146323 A1 Jul. 7, 2005

(30) Foreign Application Priority Data

Dec. 19, 2003 (DE) ............................... 103 60 406

(51) Int. Cl.
*G01B 7/14* (2006.01)
*G01B 7/30* (2006.01)
*G01F 23/30* (2006.01)
*G01F 23/32* (2006.01)

(52) U.S. Cl. ................... 324/207.26; 73/313; 73/314;
73/317; 116/227

(58) Field of Classification Search ........... 324/207.26;
73/313, 314, 317; 166/227
See application file for complete search history.

(56) References Cited

U.S. PATENT DOCUMENTS

| 4,726,746 | A | | 2/1988 | Takada et al. | |
|---|---|---|---|---|---|
| 4,920,797 | A | * | 5/1990 | Swartz et al. | ................. 73/309 |
| 5,637,995 | A | | 6/1997 | Izawa et al. | |
| 6,199,428 | B1 | | 3/2001 | Estevez-Garcia et al. | |
| 6,401,533 | B1 | * | 6/2002 | Gier et al. | .................... 73/313 |
| 2002/0043105 | A1 | | 4/2002 | Beck, II | |

FOREIGN PATENT DOCUMENTS

| DE | 199 51 342 A1 | 4/2001 |
|---|---|---|
| DE | 101 42 618 A1 | 3/2003 |

* cited by examiner

*Primary Examiner*—Reena Aurora
(74) *Attorney, Agent, or Firm*—Griffin & Szipl, P.C

(57) ABSTRACT

A sensor element (30) measures a Hall voltage generated by a movable magnet (16). For this purpose, the sensor element (30) comprises a ceramic base element (40) which has connected therewith a detector element (46). The detector element (46) is protected with the aid of a cover element (42) against an aggressive environment produced by fuel or fuel vapors in a fuel tank (34) of a motor vehicle. The detector element (46) has connected therewith electric conductors (60) which are routed through the cover element (42) and/or the base element (40) for connecting the detector element (46) with a voltage source and/or an evaluation unit. The cover element (42) and possibly the base element (40) reliably encapsulate the detector element (46) against the aggressive environment such that by simple constructive measures the service life of the sensor element (30) is increased.

10 Claims, 4 Drawing Sheets

SENSOR ELEMENT

This application claims priority from German Patent Application No. 103 60 406.5, filed Dec. 19, 2003, the entire disclosure of which is incorporated herein by reference.

BACKGROUND OF THE INVENTION

1. Field of the Invention

The present invention relates to a sensor element for contactlessly measuring a magnetic field in an aggressive environment, in particular for use in a fuel tank of a motor vehicle.

2. Description of the Related Art

From DE 101 42 618 A1 a contactlessly operating level indicator is known which uses a Hall effect sensor as a sensor element for measuring a fill level in a fuel tank, said Hall effect sensor detecting the magnetic field of a magnet. The magnet is connected via a lever with a float such that the measured magnetic field of the magnet varies as a function of the fill level in the fuel tank. The lever is rotatably supported via a rotary axis. The rotary axis is partially embraced by the magnet configured as a ring magnet. The ring magnet is arranged between the Hall effect sensor and the rotary axis. The magnet is disposed in a two-piece housing, wherein the housing halves are closed in a liquid-proof manner by means of cast resin. To protect the Hall effect sensor against the aggressive environment in the fuel tank, the sensor is arranged in a pocket formed in a housing, said pocket also being filled with cast resin.

A drawback of such a sensor element is that considerable constructive efforts are required for protection of the sensor element. It is necessary to use components with complicated geometries which are difficult and expensive to manufacture.

Further, the cast resin does not offer sufficient protection since fuel, which flows along the housing wall thus coming in contact with the cast resin, gradually diffuses through the cast resin such that the sensor element becomes, for example, damaged by corrosion, which results in a relatively short service life of the sensor element.

SUMMARY OF THE INVENTION

It is an object of the invention to provide a sensor element which has a longer service life in an aggressive environment.

According to the invention, a sensor element, which measures a magnetic field generated by a movable magnet, comprises a base element made from an electrically insulating material, in particular a ceramic material, such as $Al_2O_3$. The base element has connected therewith a detector element which detects the direction and/or the strength of the magnetic field via a physical effect, e. g. a Hall effect. Further, the base element is connected with a metal cover element. The cover element is arranged at a distance to the detector element, i. e. the detector element is covered by the cover element without any direct electrical contact and is thus protected against the environment. The detector element has connected therewith electric conductors which are routed through the cover element and/or the base element to establish a connection with a voltage source and/or an evaluation unit.

The cover element and possibly also the base element isolate the detector element to a large extent from the environment. The metal cover element and possibly the base element are diffusion-resistant at least towards fuel, i. e. a diffuse substance transport through the cover element and possibly the base element is, in contrast to cast resin or plastic material, not detectable. Where joint connections exist between the cover element and the base element, which are accessible from the aggressive environment, the connection of the cover element and the base element is preferably an integral connection made, for example, by soldering such that the joint connections, too, are diffusion-resistant at least towards fuel. To improve the solderability of the metal cover element to the base element, the base element is made, for example, from a solderable metallized ceramic material such that at least the metal constituents of the ceramic material can be fused to create the integral connection. The detector element is sufficiently protected against an aggressive environment, which is produced in particular by fuel vapors in a fuel tank, by the configuration according to the invention of the sensor element such that the service life is considerably increased. Further, the cover element and the base element may have a particularly simple geometry such that the manufacture of the sensor element according to the invention is simplified and thus less expensive. In addition, it is not absolutely necessary that the detector element is sheathed with cast resin for protection purposes. For better fixing of the position of the detector element it may be advantageous to fill the free space in the cover element with a fluid which is capable of flowing, not electrically conducting and capable of curing.

The detector element comprises in particular a Hall effect sensor for detecting the magnetic field of the magnet via the Hall effect by measuring a Hall voltage. Preferably, the detector element additionally or alternatively comprises an AMR sensor (anisotropic magneto-resistance sensor) and/or a GMR sensor (giant magneto-resistance sensor). In the case of the AMR/GMR sensor the electrical resistance, in particular that of an inexpensive ferrite, e. g. a ferromagnetic layer, is changed by the magnetic field and/or the direction of the magnetic field of the magnet, wherein the change is essentially independent of the field strength of the magnet. Thus special requirements regarding the field strength of the magnet used need not be met. The magneto-resistance effect of the AMR/GMR sensor can be measured with the aid of a bridge circuit and, as in the case of a Hall effect sensor, be converted into a voltage change. Further, the AMR/GMR sensor can be made considerably smaller than a Hall effect sensor.

The sensor element preferably comprises a cover capsule. The cover capsule comprises the cover element and a lid connected therewith. The cover capsule encapsulates the detector element, possibly together with the base element, i. e. it offers protection against an aggressive environment. The lid is preferably made from the same material as the cover element and is connected, for example by soldering, with the latter in particular via an integral connection. Preferably, the base element is completely arranged inside the cover element. This allows the base element to be positioned relative to the cover element without an unintended change in the position of the base element occurring, for example when the lid is being connected with the cover element. It is further possible to connect the lid and the cover element at a front side or narrow side of the cover element. This allows the joint connection face between the lid and the cover element to be made particularly small. Further, the lid and the cover element may be connected, if possible, at a location which is particularly far away from the aggressive environment. This further improves the protection of the detector element and increases the service life.

In a preferred embodiment the cover element and/or the base element comprise a projection extending away from the detector element. The projection serves for limiting an insertion depth of the cover element in an opening. For this purpose, the projection is, for example, configured as a protruding nose such that, when the sensor element passes through an opening, the projection abuts against the component comprising the opening, whereby the maximum insertion depth is defined. The projection allows the sensor element according to the invention to be used as an independent module for a contactlessly operating level indicator by employing particularly simple constructive means.

The projection may, for example, be configured as a shoulder formed by a thickened portion of the material or bulging-out of the material. Thus a step is formed which may act as a stopper to limit the insertion depth. In particular, the projection forms, together with an outside of the cover element and/or the base element, a concave right angle. Thus the stopper face and the outside are disposed orthogonally to each other which results in a pointed fillet. In the fillet, i. e. in the right angle, a seal, such as an O-ring, can be arranged in a defined position.

Preferably, the projection is arranged around the circumference such that the projection does not only act as a stopper but also as a splash guard which diverts aggressive media, such as fuel, from that portion of the sensor element which faces away from the aggressive medium. When the cover element is connected with the lid or the like behind the projection, as seen from the aggressive medium, an additional protection of the encapsulated detector element is obtained.

The electric conductors of the sensor element according to the invention may be cables which are routed, for example, through an opening to the outside, wherein the opening is sealed in particular by a corrosion-resistant and diffusion-resistant seal. Preferably, at least one of the electric conductors is configured as a conductor conduit arranged in the base element. The base element is thus of similar configuration as a printed circuit board, wherein said "circuit board" is of multi-layer configuration to sheath the conductors preferably around the overall circumferential surface. The detector element can be connected with the respective conductor via individual solder joints.

Additionally and/or alternatively, the cover element and/or a lid connected with the cover element may comprise a contact element for conducting electric current. The contact element is preferably electrically insulated towards the cover element and/or the lid and has in particular an electrical resistance which is as low as possible. The contact element allows electric current to pass the cover element, the cover capsule and/or the lid, wherein the ingress of aggressive media is prevented.

The invention further relates to a contactlessly operating level indicator, in particular for a fuel tank in a motor vehicle. The level indicator comprises a rotatably supported lever which is connected with a float and a magnet. In dependence on the position of the float the lever is rotated, whereby the position of the magnet is changed. Between the magnet and a rotary axis a sensor element is arranged which is in particular configured as described above. The sensor element is arranged such that the magnetic field measured by the sensor element changes as a function of the position of the float.

Due to the fact that the sensor element is arranged between the rotary axis and the magnet and not the magnet between the rotary axis and the sensor element, the movable magnet is located farther away from the rotary axis such that the magnet travels a larger distance when the position of the float is changed. Due to the longer path travelled by the magnet, the magnetic field measured by the sensor element changes to a larger extent at a comparable change in the position of the float. The sensor element can thus be of smaller and compacter configuration and can measure the fill level with a higher accuracy. Further, it is sufficient to protect only the detector element of the sensor element against fuels and fuel vapors or the like since the other components do not comprise any sensitive electric elements. The contactlessly operating level indicator can thus be of simple configuration.

The magnet is preferably configured at least as a segment of a ring magnet. This results in a relatively uniform and undisturbed magnetic field which is measured by the sensor element. For further disturbance elimination the sensor element may be provided with disturbance-elimination modules, whereby the measuring accuracy is improved.

In a preferred embodiment the level indicator comprises an intermediate piece with which the lever is rotatably connected. Further, the intermediate piece comprises an opening for receiving the sensor element. The sensor element is arranged in the opening such that the detector element of the sensor element is associated with the side of the intermediate piece facing the lever. The sensor element can thus, for example, be guided outside the fuel tank through the opening of the intermediate piece and, in particular partly, into the fuel tank. In particular the sensor element comprises a projection which, in the form of a stopper, bears on the side of the intermediate piece facing away from the lever. This in particular allows the detector element to be arranged in a completely encapsulated condition at the side of the intermediate piece facing the lever, wherein the connection with the lid and the conductor ends of the conductors are disposed at the side of the intermediate piece facing away from the lever. Owing to this arrangement the detector element of the sensor element is further protected by the intermediate piece, for example due to the fact that the intermediate piece acts as a splash guard.

The invention further relates to a level indicator assembly comprising a fuel tank and a level indicator connected therewith, which is in particular configured as described above. The fuel tank comprises a receiving opening for receiving a sensor element or an intermediate piece. The sensor element disposed in the receiving opening such that the detector element is arranged inside the fuel tank and the conductor ends of the electric conductors are arranged outside the fuel tank. If existing, in particular the connection between a cover element and a lid of the sensor element is also disposed outside the fuel tank. With this arrangement a reliable protection of the detector element against the fuel in the fuel tank can be realized with the aid of simple constructive means. The improved protection of the detector element against fuel and/or fuel vapors increases the service life of the level indicator assembly.

BRIEF DESCRIPTION OF THE DRAWINGS

Hereunder preferred embodiments of the invention are explained in detail with reference to the appended drawings in which.

DETAILED DESCRIPTION OF THE PREFERRED EMBODIMENTS OF THE INVENTION

Figure 1:
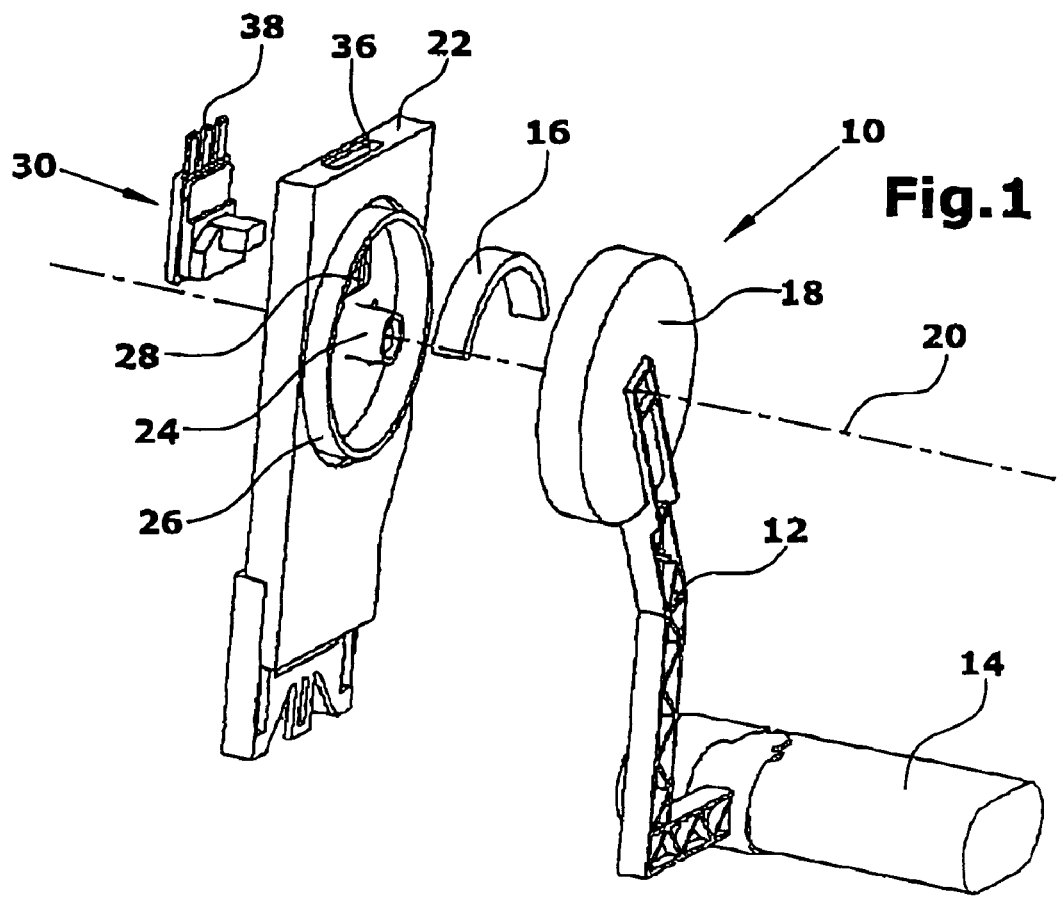
FIG. 1 shows a schematic perspective exploded view of a contactlessly operating level indicator according to the invention, FIG. 2 a schematic perspective view of the level indicator shown in FIG. 1, FIG. 3 a schematic sectional view of a first embodiment of a sensor element according to the invention in built-in condition, FIG. 4 a schematic sectional view of a second embodiment of the built-in sensor element, FIG. 5 a schematic sectional view of a third embodiment of the built-in sensor element, FIG. 6 a schematic sectional view of a fourth embodiment of the built-in sensor element, and FIG. 7 a schematic sectional view of a fifth embodiment of the built-in sensor element.
Figure 2:
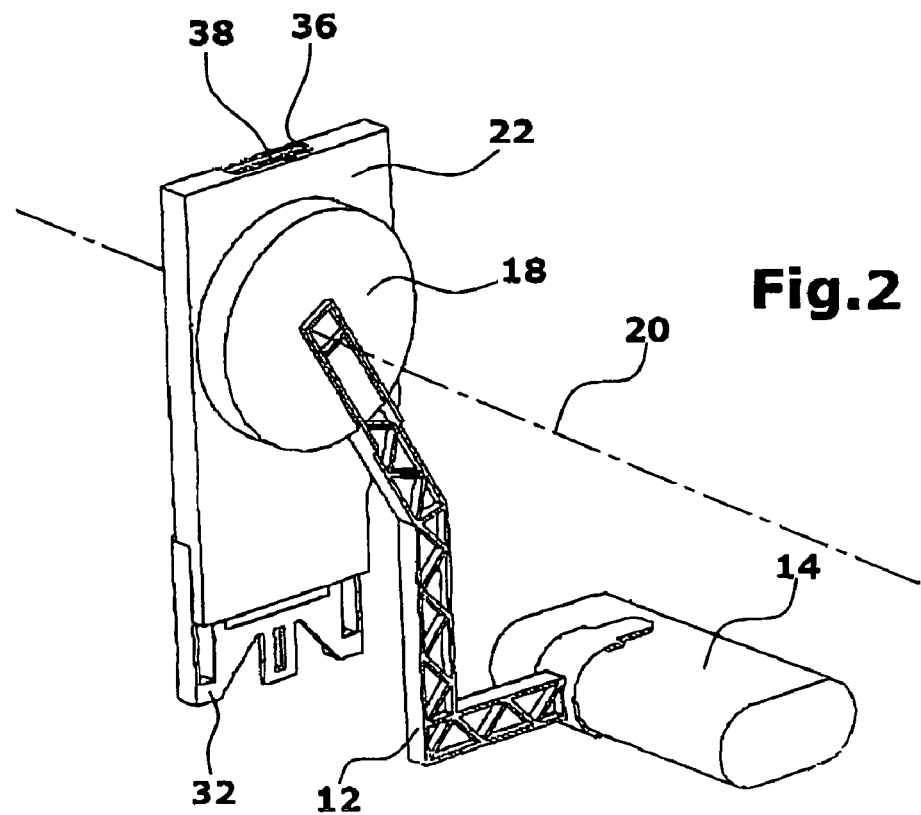

The contactlessly operating level indicator 10 according to the invention comprises a lever 12 connected with a float 14 and a magnet 16 which is in particular configured as a segment of a ring magnet. The magnet 16 is indirectly connected via a first housing portion 18 with the lever 12. The lever 12 is, together with the first housing portion 18 and the magnet 16, connected with an intermediate piece 22, whereby they are pivotable about a rotary axis 20. The intermediate piece 22 comprises a tubular boss 24 via which the lever 12 is supported. For this purpose, the lever 12 and/or the first housing portion 18 comprise a bolt which is, for example, rotatably connected with the boss 24 by means of clips. For additionally stabilizing the rotary movement of the lever 12 the intermediate piece 22 comprises a second housing portion 26 which supports the first housing portion 18. Further, the first housing portion 18 and the second housing portion 26 prevent fuel, which might splash against the level indicator, from entering into the interior of the housing portions 18,26.

The intermediate piece 22 further comprises an opening 28 for receiving a sensor element 30. The sensor element 30 is arranged in the opening 28 such that it is located between the magnet 16 and the rotary axis 20 and measures in an almost hysteresis-free manner the magnetic field generated by the magnet 16. The intermediate piece 22 further comprises a connecting element 32 for connecting the level indicator 10 with a fuel tank 34. Thus the intermediate piece 22 forms in particular a part of the fuel tank 34. The intermediate piece 22 may include a lead-through opening 36 for routing electric terminals 38 of the sensor element 30 to a voltage source and/or an evaluation unit. In the evaluation unit the characteristic curve taken up by the sensor element 30 can be further processed by, for example, programming and/or calibrating the characteristic curve.

In the first embodiment of the sensor element 30 (FIG. 3) a metal cover element 42 is soldered to a base element 40. Inside an encapsulated space 44 formed by the base element 40 and the cover element 42 a detector element 46 is arranged. The detector element 46 may be a Hall effect element and/or an AMR sensor and/or a GMR sensor. The detector element 46 is placed onto the ceramic base element 40. The base element 40 comprises conductor conduits 48 which are connected via solder joints 50 with the detector element 46.

The sensor element 30 is arranged in an opening which may be the opening 28 of the intermediate piece 22 or a receiving opening 52 of the fuel tank 34.

Figure 3:
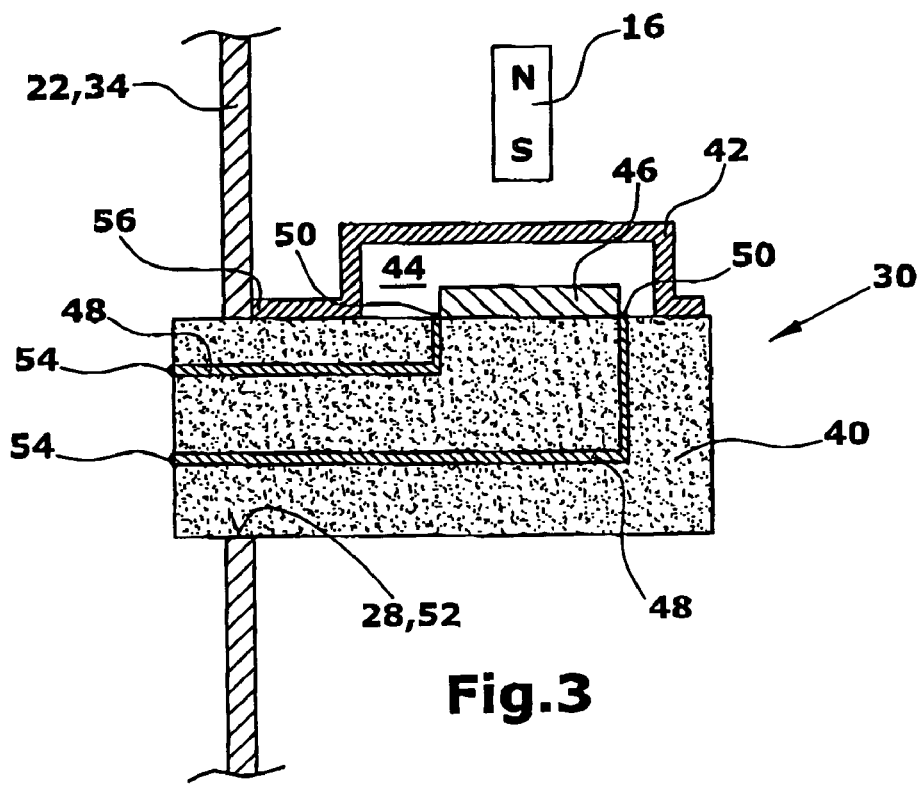

The sensor element 30 is disposed in the opening 28 and/or the receiving opening 52 such that the detector element 46 is arranged inside the fuel tank 34. Thereby the conductor ends 54 of the conductor conduits 48 are arranged outside the fuel tank 34, whereby the conductor ends 54 can be soldered, outside the fuel tank 34 in a non-aggressive environment, via solder joints or the like to electric cables or terminals 38. In FIG. 3 the cover element 42 is inserted from the right into the opening 28,52. For positioning purposes, the cover element 42 comprises a shoulder 56 which, in the form of a stopper, limits the insertion depth of the sensor element 30. This allows the detector element 46 to be arranged centrally relative to the magnet 16. The detector element 46 and the magnet 16 are thus essentially aligned with each other such that the detector element 46 is arranged in an essentially homogeneous and undisturbed magnetic field.

Figure 4:
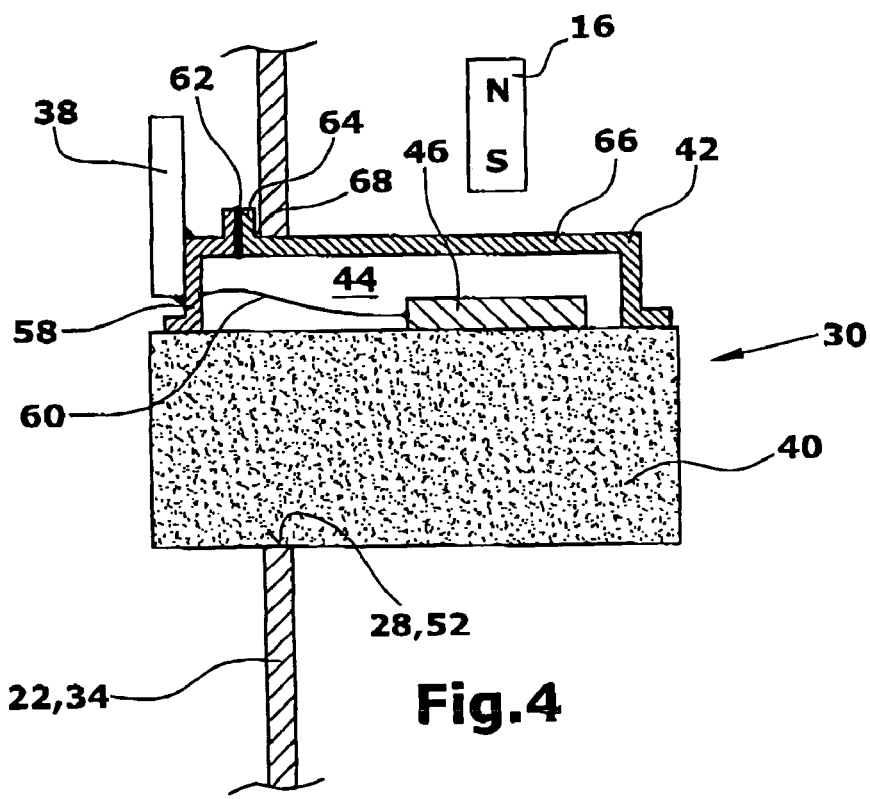

In the second embodiment of the Hall effect sensor element 30 (FIG. 4) the cover element 42 comprises contact elements 58 which are connected via electric conductors 60 with the detector element 46. Each contact element 58 is connected, for example by soldering, with an electric terminal 38. The contact elements 58 are insulated towards the remaining cover element 42 with the aid of an insulating means 62 such that short-circuits are prevented.

The cover element 42 comprises a projection 64 which is arranged at a right angle to a surface 66 of the cover element 42. Thus a right angle 68 is formed between the projection 64 and the surface 66. During assembly the sensor element 30 is inserted, in FIG. 4, from the left into the opening 28,52 such that the projection 64, acting as a stopper, limits the insertion depth. Due to the right angle 68 both the projection 64 and the surface 66 are, in the built-in condition, in contact with the intermediate piece 22 and/or the fuel tank 34.

Figure 5:
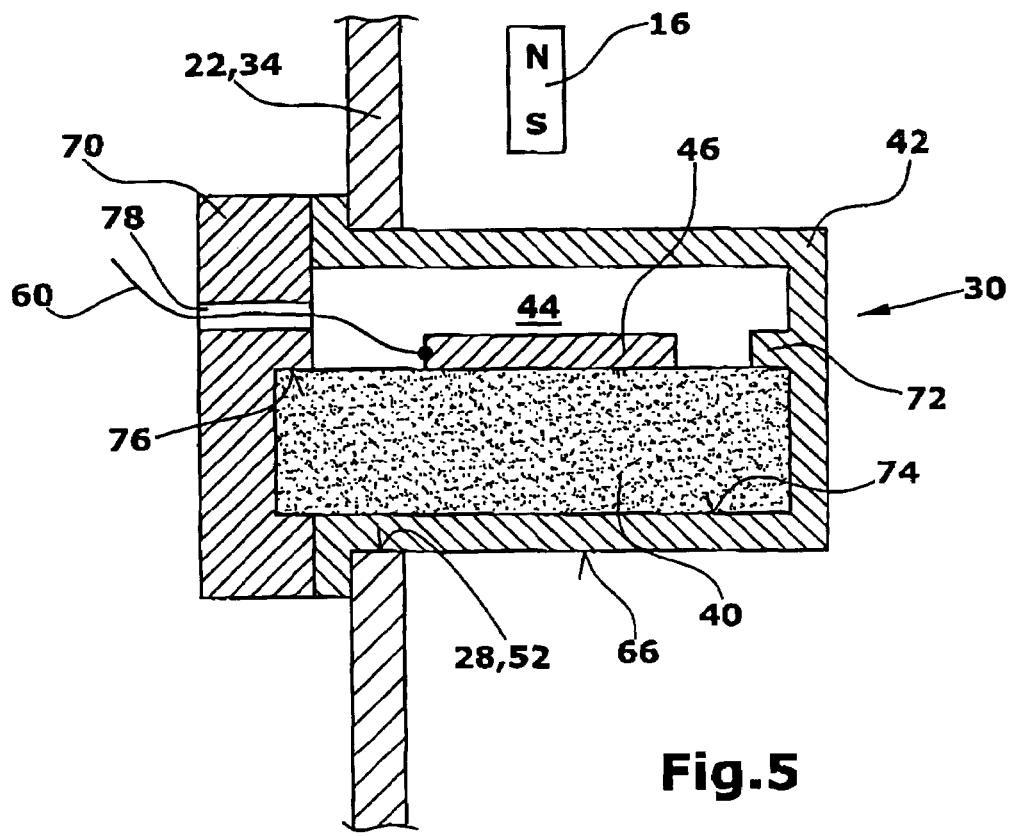

In the third embodiment of the sensor element 30 (FIG. 5) the sensor element 30 is provided with a cover capsule comprising the cover element 42 and a lid 70. The base element 40 is completely arranged inside the cover capsule. The cover element 42 comprises a nose 72 which is arranged at a distance to the bottom 74 of the cover element 42, which corresponds to the thickness of the base element 40. This allows the base element 40 to be connected, in a fixed positional arrangement, with the cover element such that soldering is not necessary. Accordingly, the lid 70 comprises a recess 76 which also corresponds to the thickness of the base element 40. The base element 40 is held by both the cover element 42 and the lid 70.

The lid 70 and the cover element 42 are preferably integrally connected with each other, in particular by soldering. To connect the detector element 46 with an evaluation unit and/or a voltage source, the lid 70 further comprises a connecting opening 78 through which the conductors 60 can be routed.

Figure 6:
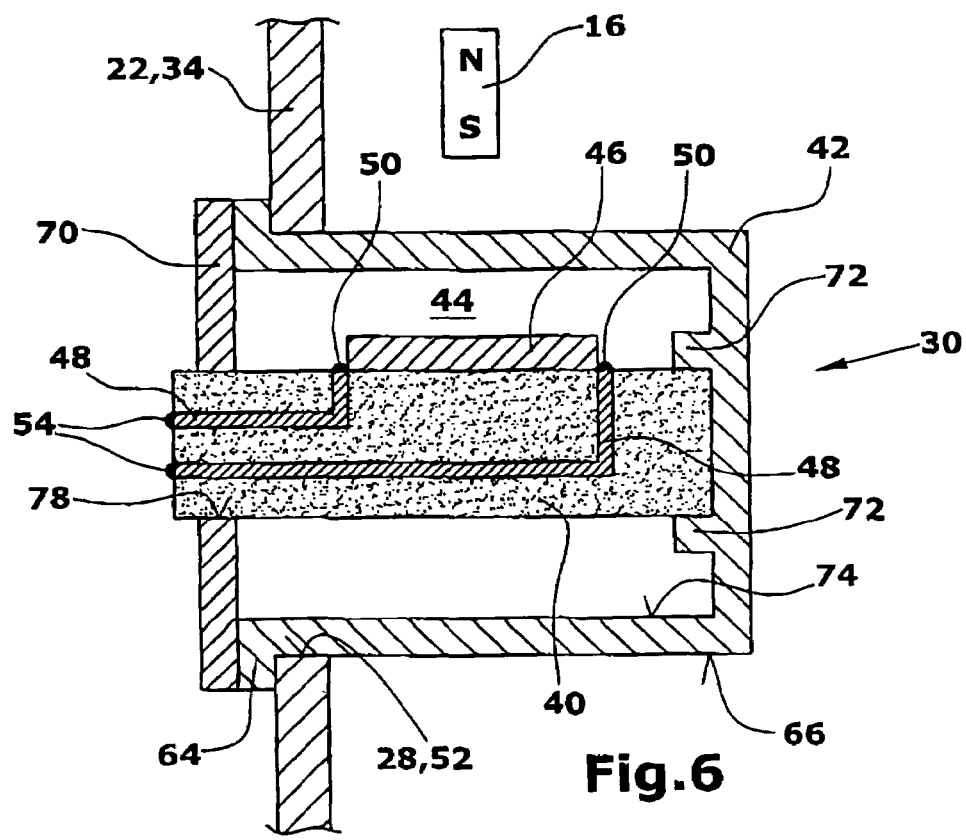

In the fourth embodiment of the sensor element 30 (FIG. 6) the base element 40, which comprises conductor conduits 48, is guided through a correspondingly large connecting opening 78 of the cover 70 such that the conductor ends 54 are arranged outside the fuel tank 34. In contrast to the embodiment of the sensor element 30 shown in FIG. 5, the recess 76 is configured as a connecting opening 78 extending through the lid 70, whereby a processing step during the manufacture of the lid 70 is made superfluous.

Figure 7:
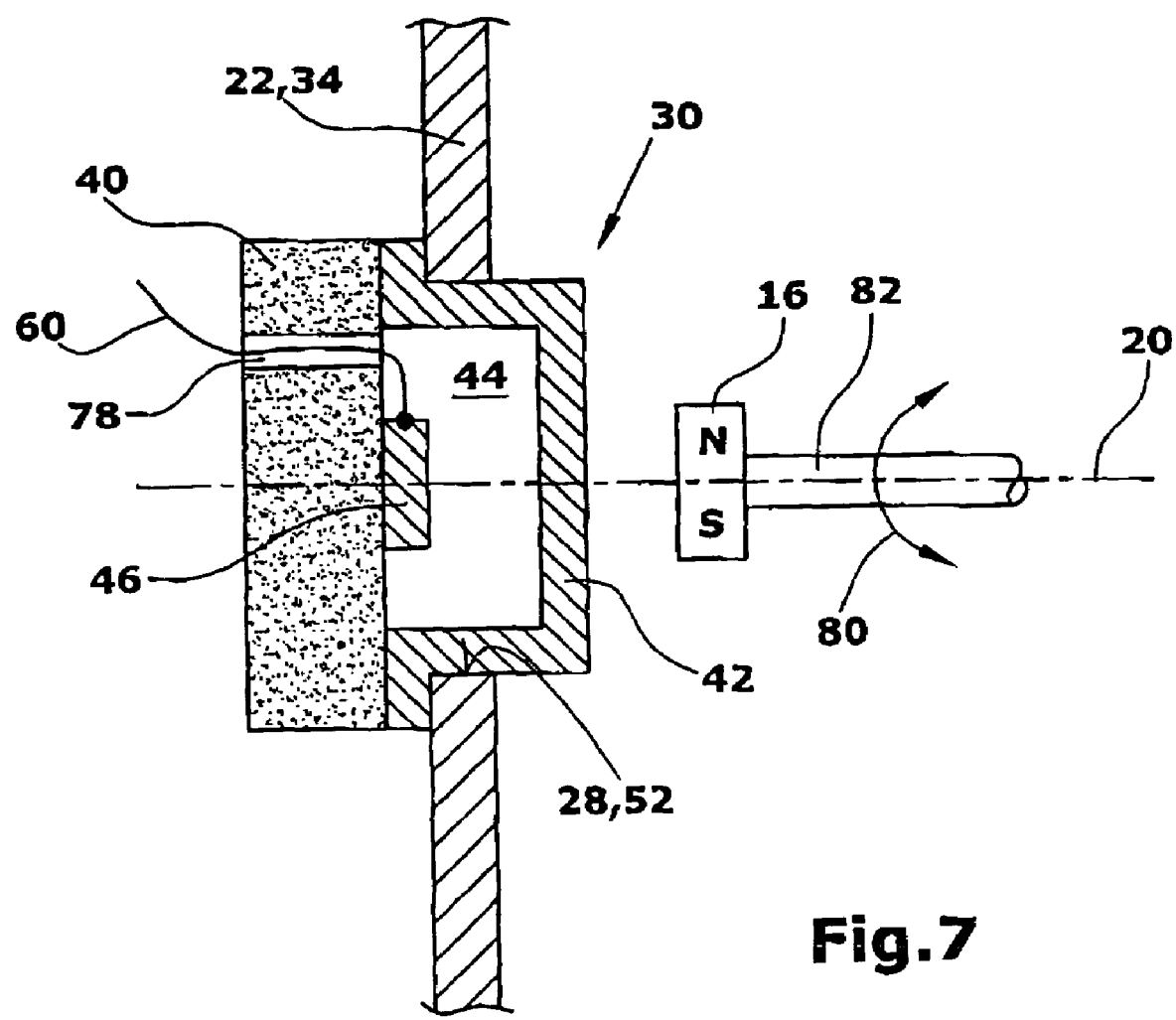

In contrast to the previously described embodiments, the sensor element 30 may be installed in a condition as turned by 90° (FIG. 7). This arrangement of the sensor element 30 is in particular suitable when an AMR/GMR sensor is used as the detector element 46. The detector element 46 and the magnet 16 are preferably arranged centrally relative to the rotary axis 20 such that, when the magnet 16 is rotated in the direction indicated by an arrow 80, the direction of the magnetic field generated by the magnet 16 is changed. The change in the direction of the magnetic field is detected by the detector element 46. In this arrangement, the level indicator 10 can comprise a rotary shaft 82 instead of the lid-shaped housing portion 18, the rotary shaft 82 being connected with the magnet 16. In this embodiment, the magnet 16 may in particular be a bar magnet such that a ring-shaped embodiment is not required. Further, the sensor element 30 can be connected at its rear side, i. e. at the side facing away from the magnet 16, with a film, in particular an adhesive film. This allows the sensor element 30 to be connected with the intermediate piece 22 and/or the fuel tank 34 in a particularly simple manner.

Although the invention has been described and illustrated with reference to specific illustrative embodiments thereof, it is not intended that the invention be limited to those illustrative embodiments. Those skilled in the art will recognize that variations and modifications can be made without departing from the true scope of the invention as defined by the claims that follow. It is therefore intended to include within the invention all such variations and modifications as fall within the scope of the appended claims and equivalents thereof.

What is claimed is:

1. A contactlessly operating level indicator for a fuel tank in a motor vehicle, comprising:
   (a) a rotatably supported lever connected with a float and a magnet; and
   (b) a sensor element for measuring a magnetic field generated by a movable magnet, comprising
      i. a base element made from an electrically insulating material;
      ii. a detector element connected with the base element;
      iii. a metal cover element connected with the base element at a distance to the detector element; and
      iv. electric conductors connected with the detector element and routed through the cover element, or the base element, or the cover element and the base element, for connection with a voltage source, or an evaluation unit, or the voltage source and the evaluation unit,
   wherein the magnet connected with the lever is arranged between the sensor element and a rotary axis of the lever such that, as a function of the position of the float, the magnetic field measured by the sensor element is changed, and wherein the fuel tank comprises a receiving opening for receiving the sensor element or an intermediate piece, the sensor element being guided through the receiving opening such that the detector element is arranged inside the fuel tank and conductor ends of the electric conductors are arranged outside the fuel tank.

2. The level indicator according to claim 1, wherein an intermediate piece has rotatably connected therewith the lever and has an opening, wherein the sensor element is arranged in the opening of the intermediate piece such that the detector element is associated with a side of the intermediate piece facing the lever, and a projection of the sensor element bears, in the form of a stopper, on the side of the intermediate piece facing away from the lever.

3. The level indicator according to claim 1, wherein the detector element comprises one or more components selected from the group consisting of a Hall effect sensor, an AMR sensor and a GMR sensor.

4. The level indicator according to claim 1, wherein a cover capsule comprises the cover element connected with a lid.

5. The level indicator according to claim 1, wherein the base element is completely arranged inside the cover element.

6. The level indicator according to claim 5, wherein the projection forms a concave right angle together with the outside facing away from the detector element.

7. The level indicator according to claim 1, wherein the cover element, or the base element, or the cover element and the base element, comprise a projection configured as a shoulder that extends away from the detector element and is provided around a circumference for limiting insertion depth of the cover element in an opening.

8. The level indicator according to claim 1, wherein at least one of the electric conductors is configured as a conductor conduit arranged in the base element.

9. The level indicator according to claim 1, wherein the cover element comprises at least one contact element for conducting electric current.

10. A contactlessly operating level indicator for a fuel tank in a motor vehicle, comprising:
    (a) a rotatably supported lever connected with a float and a magnet; and
    (b) a sensor element for measuring a magnetic field generated by a movable magnet, comprising
       i. a base element made from an electrically insulating material;
       ii. a detector element connected with the base element;
       iii. a metal cover element connected with the base element at a distance to the detector element; and
       iv. electric conductors connected with the detector element and routed through the cover element, or the base element, or the cover element and the base element, for connection with a voltage source, or an evaluation unit, or the voltage source and the evaluation unit,
    wherein the magnet connected with the lever is arranged between the sensor element and a rotary axis of the lever such that, as a function of the position of the float, the magnetic field measured by the sensor element is changed, wherein an intermediate piece has rotatably connected therewith the lever and has an opening, wherein the sensor element is arranged in the opening of the intermediate piece such that the detector element is associated with a side of the intermediate piece facing the lever, and a projection of the sensor element bears, in the form of a stopper, on the side of the intermediate piece facing away from the lever.

* * * * *